(12) United States Patent
Maruyama et al.

(10) Patent No.: US 9,324,593 B2
(45) Date of Patent: *Apr. 26, 2016

(54) WAFER PROCESSING TAPE

(75) Inventors: Hiromitsu Maruyama, Tokyo (JP);
Noboru Sakuma, Tokyo (JP);
Yasumasa Morishima, Tokyo (JP);
Shinichi Ishiwata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 13/342,535

(22) Filed: Jan. 3, 2012

(65) Prior Publication Data

US 2012/0100325 A1  Apr. 26, 2012

Related U.S. Application Data

(62) Division of application No. 12/675,593, filed as application No. PCT/JP2008/062784 on Jul. 16, 2008.

(30) Foreign Application Priority Data

Sep. 14, 2007 (JP) ................. 2007-238865
Mar. 18, 2008 (JP) ................. 2008-068670
Jul. 1, 2008 (JP) ................. 2008-172022

(51) Int. Cl.
*C09J 7/02* (2006.01)
*H01L 21/67* (2006.01)
*H01L 21/683* (2006.01)

(52) U.S. Cl.
CPC ............. *H01L 21/67132* (2013.01); *C09J 7/02* (2013.01); *H01L 21/6836* (2013.01);

(Continued)

(58) Field of Classification Search
USPC ....................................... 428/352
See application file for complete search history.

(56) References Cited

U.S. PATENT DOCUMENTS 7,232,501 B2 *  6/2007  Katoh et al. ............... 156/270
2005/0133973 A1 *  6/2005  Parrish et al. ............ 264/645

FOREIGN PATENT DOCUMENTS

DE         4421485 A1   12/1995
EP         1548821 A2    6/2005

(Continued)

OTHER PUBLICATIONS

Takayuki et al., JP 2005-350520, Dec. 22, 2005 (Machine Translation).*

(Continued)

*Primary Examiner* — Cheng Huang
(74) *Attorney, Agent, or Firm* — Oblon, McClelland, Maier & Neustadt, L.L.P.

(57) ABSTRACT

A wafer processing tape includes a release film having a large length; an adhesive layer formed on a first surface of the release film and having a predetermined planar shape; a pressure-sensitive adhesive film having a label portion and a surrounding portion surrounding outside the label portion; and a support member formed on a second surface of the release film opposite to the first surface on which the adhesive layer and the pressure-sensitive adhesive film are formed. The label portion has a predetermined planar shape and covers the adhesive layer so that the label portion contacts with the release film around the adhesive layer. The support member is disposed at both end portions of the release film in a short side direction of the release film. The support member has a coefficient of linear expansion of 300 ppm/° C. or less.

10 Claims, 4 Drawing Sheets

(52) U.S. Cl.
CPC . *C09J 2203/326* (2013.01); *H01L 2221/68327* (2013.01); *Y10T 428/1467* (2015.01); *Y10T 428/28* (2015.01); *Y10T 428/2878* (2015.01)

(56) References Cited

FOREIGN PATENT DOCUMENTS

| | | | | |
|---|---|---|---|---|
| JP | 59-48511 U | 3/1984 | | |
| JP | 04-170488 A | 6/1992 | | |
| JP | 11-109131 | 4/1999 | | |
| JP | 2000-203765 A | 7/2000 | | |
| JP | 2000-221888 | 8/2000 | | |
| JP | 2004-035836 | 2/2004 | | |
| JP | 2004035836 | * 2/2004 | ............. | B32B 38/10 |
| JP | 2004-331869 | 11/2004 | | |
| JP | 2005-350520 A | 12/2005 | | |
| JP | 2006-001253 | 1/2006 | | |
| JP | 2006-224581 | 8/2006 | | |
| JP | 2007-002173 | 1/2007 | | |
| WO | 2005-123861 | 12/2005 | | |

OTHER PUBLICATIONS

European Patent Office, Extended European Search Report for European Patent Application 08791179.8, Oct. 5, 2010.
Notice for a Reason of Rejection for Japanese Patent Application 2008-068670, Japanese Patent Office, Aug. 5, 2011.
Extended European Search Report for European Patent Application 10177278.8, European Patent Office, May 30, 2012.
Decision of Refusal for Japanese Patent Application 2008-068670, Japanese Patent Office, Mar. 23, 2012.
Office Action for Chinese Patent Application 2010104557.1, Patent Office for China, Dec. 19, 2012.
U.S. Appl. No. 14/505,352, filed Oct. 2, 2014, Aoyama, et al.
U.S. Appl. No. 14/505,329, filed Oct. 2, 2014, Aoyama, et al.
U.S. Appl. No. 14/505,143, filed Oct. 2, 2014, Aoyama, et al.

* cited by examiner (a)

(b)

WAFER PROCESSING TAPE

CROSS-REFERENCE TO RELATED APPLICATIONS

This is a divisional application of the prior application Ser. No. 12/675,593 filed Feb. 26, 2010, pending.

TECHNICAL FIELD

The present invention relates to a wafer processing tape. More particularly, the present invention relates to a wafer processing tape with functions of a dicing tape and a die bonding film.

BACKGROUND ART

Recently, a dicing die bonding tape has been developed, which has functions of a dicing tape adopted to fix a semiconductor wafer thereon in a dicing step where the semiconductor wafer is cut into individual chips, and a die bonding film (a die attach film) adopted to attach the semiconductor chip to a lead frame or a package substrate, or to stack the semiconductor chip in a stack package.

The dicing die bonding tape is pre-cut in consideration of workability such as attachment to a semiconductor wafer, attachment to a ring frame in a dicing process, and the like.

An example of the pre-cut dicing die bonding tape is shown in FIG. 8 and FIGS. 9(a) and 9(b). FIG. 8 shows a conventional dicing die bonding tape wound in a roll shape, FIG. 9(a) is a plan view showing the conventional dicing die bonding tape, and FIG. 9(b) is a sectional view taken along the line B-B of FIG. 9(a). As shown, the conventional dicing die bonding tape 50 includes a release film 51, an adhesive layer 52, and a pressure-sensitive adhesive film 53. The adhesive layer 52 is formed in a round shape corresponding to a shape of a semiconductor wafer, and has a round label shape. The pressure-sensitive adhesive film 53 is formed by removing a surrounding area of a round portion corresponding to a shape of a ring frame for dicing. As shown, the pressure-sensitive adhesive film 53 includes a round label portion 53a and a surrounding portion 53b surrounding an outside edge of the round label portion 53a. The adhesive layer 52 and the round label portion 53a of the pressure-sensitive adhesive film 53 are stacked on each other, while centers thereof are aligned. Further, the round label portion 53a of the pressure-sensitive adhesive film 53 covers the adhesive layer 52 and contacts with the release film 51 on a surrounding thereof.

In the dicing step of the semiconductor wafer, the release film 51 is peeled off from the stack of the adhesive layer 52 and the pressure-sensitive adhesive film 53. As shown in FIG. 10, an underside of the semiconductor wafer W is attached on the adhesive layer 52, and a dicing ring frame R is fixedly attached on the surrounding periphery of the round label portion 53a of the pressure-sensitive adhesive film 53. In this state, the dicing of the semiconductor wafer W is carried out. Afterward, the pressure-sensitive adhesive film 53 is cured through ultraviolet irradiation. Then, the semiconductor chips are picked up. At this time, since an adhesive force of the pressure-sensitive adhesive film 53 is decreased by the curing treatment, the pressure-sensitive adhesive film 53 is easily peeled off from the adhesive layer 52, and the semiconductor chip is picked up in a state that the underside thereof is attached to the adhesive layer 52. The adhesive layer 52 attached to the underside of the semiconductor chip serves as a die bonding film when the semiconductor chip is attached to the lead frame, the package substrate, or another semiconductor chip.

As shown in FIGS. 8, 9(a) and 9(b), in the conventional dicing die boding tape 50, an area where the adhesive layer 52 and the round label portion 53a of the pressure-sensitive adhesive film 53 are stacked on each other is thicker than the surrounding portion 53b of the pressure-sensitive adhesive film 53. Thus, when the conventional dicing die bonding tape 50 is wound in a roll shape as a product, the area where the adhesive layer 52 and the round label portion 53a of the pressure-sensitive adhesive film 53 are stacked on each other and the surrounding portion 53b of the pressure-sensitive adhesive film 53 are placed on top of each other, thereby causing a step between the two different areas to be transferred on the soft surface of the adhesive layer 52, that is, a transfer mark (e.g., label marks, wrinkles, or winding marks) as shown in FIG. 11. The formation of the transfer marks is remarkably increased especially when the adhesive layer 52 is formed of a soft resin and has a relatively large thickness or the dicing die bonding tape 50 is wound in a large number of times. When the transfer marks are formed, an adhesion defect occurs between the adhesive layer 52 and the semiconductor wafer, thereby causing a problem in the semiconductor wafer process.

To suppress the formation of the transfer marks, a substantially low pressure is applied when the dicing die bonding tape is wound. In this case, a winding shift may occur in a product. Accordingly, it is difficult to set the product on a tape mounter, thereby causing a trouble in an actual use of the tape.

To suppress the formation of the label marks, Patent Reference 1 discloses an adhesive sheet with a support layer disposed outside an adhesive layer and a pressure-sensitive adhesive film on a peeled base material. The support layer has a thickness equal to or larger than a total thickness of the adhesive layer and the pressure-sensitive adhesive film. According to Patent Reference 1, with the support layer, a winding pressure applied to the adhesive sheet is distributed or concentrated on the support layer, thereby desirably prohibiting a step between an area where the adhesive layer and the pressure-sensitive adhesive film are stacked on each other and an area where only the pressure-sensitive adhesive film is formed from being transferred to another adhesive layer.

According to the adhesive sheet disclosed in Patent Reference 1, the support layer is formed on the area of the peeled substrate except the adhesive layer and the pressure-sensitive adhesive film required for the manufacturing of the semiconductor device. Accordingly, the support layer has a limited width, and a relatively narrow width relative to outer diameters of the adhesive layer and the pressure-sensitive adhesive film, thereby making it difficult to suppress the transfer marks.

To effectively suppress the transfer marks, Patent Reference 2 discloses a laminating sheet used for laying a cover sheet on a light-receiving surface of an optical disc. In the laminating sheet, an adhesive sheet and a protecting material (support member) are laminated at different positions on a peeling sheet with a relatively long length. The protecting material is formed at both side portions of an underside of the peeling sheet in a width direction thereof (see FIG. 11 in Patent Reference 2). According to the structure wherein the support member is formed on the underside, the support member has a width in a wide range, thereby effectively suppressing the transfer marks.

Patent Reference 1: Japanese Patent Laid-Open Publication No. 2007-2173

Patent Reference 2: Japanese Patent Laid-Open Publication No. 2004-35836

DISCLOSURE OF THE INVENTION

Technical Problem

The wafer processing tape tends to be under specific environments where a temperature is changed severely. For example, the wafer processing tape is under an environment where a low temperature (in a range of −20° C. to 5° C.) during storage and delivery is changed to a room temperature for use or heating for the attachment to the semiconductor wafer. In this case, even if the support member is provided on the underside of the release film, the tape is not good for processing the semiconductor wafer. That is, under the environment where the temperature is severely changed, the support member changes a size thereof due to a change in the temperature. Accordingly, air tends to enter a space between the release film and the pressure-sensitive adhesive film and a space between the adhesive layer and the pressure-sensitive adhesive film, thereby forming voids (empty spaces) and causing an attaching defect to the semiconductor wafer. When the attaching defect occurs, a production yield may decrease in the dicing process of the semiconductor wafer, the expanding process of the tape, the picking up process of the chip, and the mounting process of the chip carried out later.

Further, when the conventional wafer processing tape is wound in a roll shape as a product as shown in FIG. 8, it is difficult to recognize a type of the product. So as to solve this problem, for example, a name of the product is printed on the round label portion 53*a* of the dicing die bonding tape 50. However, in order not to affect the dicing process, the name of the product is desirably printed on an area where the round label portion 53*a* on which the adhesive layer 52 is not laminated Accordingly, a printable space is limited, and a size and number of characters are restricted, thereby causing erroneous selection of the dicing die bonding tape. Further, when the tape is wound in the roll shape, it is difficult to recognize the type of the product through visual confirmation from a side surface of the roll (from an upper or lower direction in FIG. 8). To solve the problem, a color of a core of the roll may be changed in accordance with the type of the product. When the core has a specific color, the production cost increases, and it is necessary to stock a large number of the cores.

An object of the present invention is to provide a wafer processing tape capable of sufficiently suppressing the transfer marks on an adhesive layer when the wafer processing tape having an adhesive layer and a pressure-sensitive adhesive film formed on a release film is wound in a roll shape. Further, the wafer processing tape is capable of suppressing voids caused by a change in a temperature. Another object of the present invention is to provide a wafer processing tape capable of sufficiently suppressing the transfer marks on an adhesive layer when the wafer processing tape having an adhesive layer and a pressure-sensitive adhesive film formed on a release film is wound in a roll shape. Further, the wafer processing tape is capable of clearly recognizing a type thereof.

SUMMARY OF THE INVENTION

To achieve the above objects, according to an aspect of the present invention, a wafer processing tape includes a release film having a large length; an adhesive layer formed on a first surface of the release film and having a predetermined planar shape; a pressure-sensitive adhesive film having a label portion and a surrounding portion surrounding outside the label portion; and a support member formed on a second surface of the release film opposite to the first surface on which the adhesive layer and the pressure-sensitive adhesive film are formed. The label portion has a predetermined planar shape and covers the adhesive layer so that the label portion contacts with the release film around the adhesive layer. The support member is disposed at both end portions of the release film in a short side direction of the release film. The support member has a coefficient of linear expansion of 300 ppm/° C. or less.

According to the present invention, preferably, a difference between the coefficient of linear expansion of the support member and the coefficient of linear expansion of the release film is 250 ppm/° C. or less. Further, a coefficient of static friction between a base film constituting the pressure-sensitive adhesive film and the support member is in a range of 0.2 to 2.0.

According to the present invention, preferably, the support member is formed on the second surface of the release film in an area corresponding to outside the adhesive layer formed on the first surface of the release film. Further, the support member is formed continuously along a longitudinal direction of the release film, the support member having a thicker thickness than the adhesive layer.

According to the present invention, preferably, the support member is formed of a colored member, and the colored member has a color in accordance with a type or a thickness of the wafer processing tape.

According to the present invention, preferably, the support member has a layered structure having two or more layers.

According to the present invention, preferably, the support member is formed of a pressure-sensitive adhesive tape having a pressure-sensitive adhesive applied on a base film selected from the group consisting of polyethylene terephthalate, polypropylene, and high density polyethylene.

According to another aspect of the present invention, a wafer processing tape includes a release film having a large length; an adhesive layer formed on a first surface of the release film and having a predetermined planar shape; a pressure-sensitive adhesive film having a label portion and a surrounding portion surrounding outside the label portion; and a colored support member formed at both end portions of the release film in a short side direction of the release film having the large length. The label portion has a predetermined planar shape and covers the adhesive layer so that the label portion contacts with the release film around the adhesive layer.

According to the present invention, the colored support member may be formed on the first surface of the release film on which the adhesive layer and the pressure-sensitive adhesive film are formed, or a second surface of the release film opposite to the first surface of the release film. Preferably, the colored support member is formed on the second surface.

According to the present invention, preferably, the colored support member is formed on the second surface of the release film in an area corresponding to outside the adhesive layer formed on the first surface of the release film. Further, the colored support member is formed continuously along a longitudinal direction of the release film, and the colored support member has a thickness greater than that of the adhesive layer.

According to the present invention, preferably, the colored support member has a layered structure having two or more layers.

According to the present invention, preferably, the colored support member is formed of a pressure-sensitive adhesive tape having a pressure-sensitive adhesive applied on a base film formed of polyethylene terephthalate or polyester.

According to the present invention, preferably, the colored support member has a color in accordance with a type or a thickness of the wafer processing tape.

Advantageous Effect

According to the present invention, the wafer processing tape includes the support member having a specific physical property and formed on a backside surface of the release film, thereby suppressing transfer marks on the adhesive layer. Further, the wafer processing tape exhibits a small change in a size of the support member even under an environment where a change in a temperature is severely large, thereby reducing voids.

According to the present invention, the wafer processing tape includes the colored support member formed on a front surface or a backside surface of the release film, thereby suppressing the transfer marks on the adhesive layer. Further, it is possible to clearly recognize a type of a dicing die bonding tape.

Figure 1:
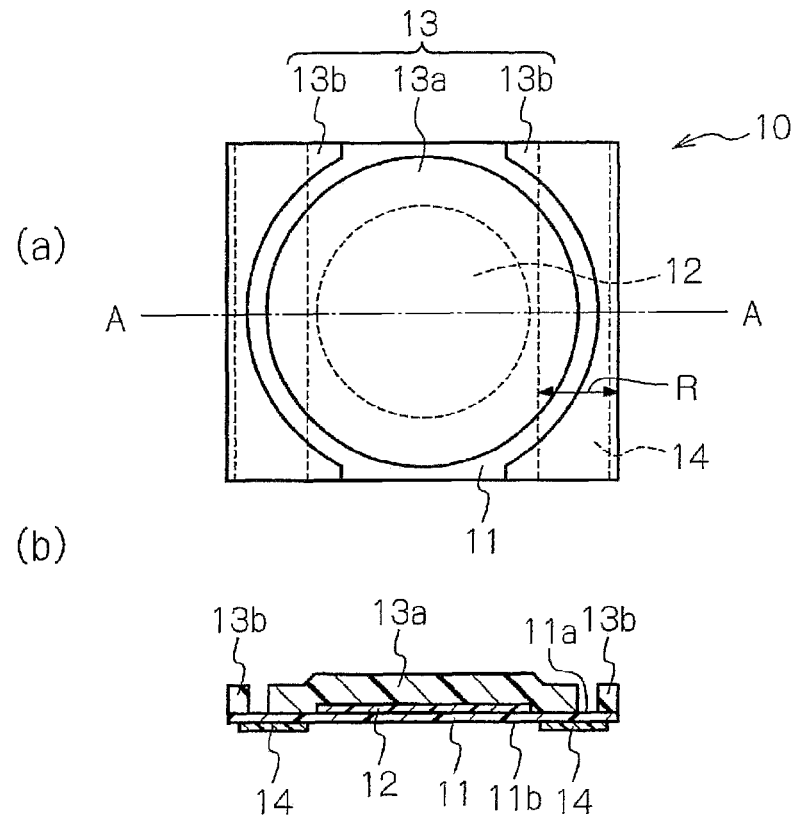
FIG. 1(a) is a plan view showing a wafer processing tape according to a first embodiment of the present invention.
FIG. 1(b) is a sectional view taken along the line A-A in FIG. 1(a).

EXPLANATION OF REFERENCE NUMERALS 10, 20: tape for processing a semiconductor wafer
11, 21: release film
12, 22: adhesive layer
13, 23: pressure-sensitive adhesive film
13a, 23a: round label portion
13b, 23b: surrounding portion
14, 14', 14": support member
24, 24', 24", 34: colored support member

DETAILED DESCRIPTION OF EMBODIMENTS

First Embodiment

An explanation of a wafer processing tape according to a first embodiment of the present invention will be explained in detail with reference to the attached drawings.

FIG. 1(a) is a plan view showing a wafer processing tape according to a first embodiment of the present invention, and FIG. 1(b) is a sectional view taken along the line A-A of FIG. 1(a).

As shown in FIGS. 1(a) and 1(b), a wafer processing tape 10 includes a release film 11 having a relatively long length, an adhesive layer 12, a pressure-sensitive adhesive film 13, and a support member 14.

The adhesive layer 12 is formed on a first surface 11a of the release film 11 and has a round label shape corresponding to the shape of the semiconductor wafer. The pressure-sensitive adhesive film 13 has a round label portion 13a adopted to cover the adhesive layer 12 in such a manner as to be brought into contact with the release film 11 around the adhesive layer 12 and a surrounding portion 13b adopted to surround the outside of the round label portion 13a. The surrounding portion 13b completely surrounds the outside of the round label portion 13a and alternatively incompletely surrounds the outside of the round label portion 13a, as shown in FIGS. 1(a) and 1(b). The round label portion 13a has a shape corresponding to the dicing ring frame. The support member 14 is formed at the both end portions of the release film 11 in a short side direction of the release film 11, on a second surface 11b of the release film 11 opposite to the first surface 11a of the release film 11 on which the adhesive layer 12 and the pressure-sensitive adhesive film 13 are formed.

Hereinafter, each component of the wafer processing tape 10 according to the first embodiment of the present invention will be in detail described.

(Release Film)

Examples of the release film 11 used in the wafer processing tape 10 are a polyethylene terephthalate (PET) film, a polypropylene film, and a film on which release coating is applied, as well known in this field.

The thickness of the release film 11 is not specifically restricted, and it is appropriately set, desirably, in a range of 25 to 50.

(Adhesive Layer)

As noted above, the adhesive layer 12 is formed on the first surface 11a of the release film 11 and has a round label shape corresponding to the shape of the semiconductor wafer.

The adhesive layer 12 is used as an adhesive attached on the underside of the chip when the chip is picked up after the semiconductor wafer is attached and diced so as to fix the chip to a substrate or a lead frame. The adhesive layer 12 is desirably formed of a pressure-sensitive adhesive including at least one selected from the group consisting of an epoxy-based resin, an acrylic-based resin, and a phenol-based resin. Besides, the adhesive layer 12 may be formed of a pressure-sensitive adhesive including a polyimide-based resin or a silicone-based resin. The thickness of the adhesive layer 12 is appropriately set, desirably, in a range of 5 to 100 μm.

(Pressure-Sensitive Adhesive Film)

As mentioned above, the pressure-sensitive adhesive film 13 has the round label portion 13a corresponding to the shape of the dicing ring frame and the surrounding portion 13b adopted to surround the outside of the round label portion 13a. The pressure-sensitive adhesive film 13 is formed by removing the surrounding area of the round label portion 13a from a film type pressure-sensitive adhesive by means of pre-cut processing.

The pressure-sensitive adhesive film 13 has a sufficiently high adhesive force at the time of dicing the semiconductor wafer so as not to peel off the semiconductor wafer therefrom and has a low adhesive force at the time of picking up the chip after the dicing so as to easily peel the chip off from the adhesive layer. For example, the pressure-sensitive adhesive film 13 is formed by applying a pressure-sensitive adhesive layer on a base film.

The base film of the pressure-sensitive adhesive film 13 desirably has a radiolucent property, if the pressure-sensitive adhesive layer as will be discussed below is formed of a radiation-curing material.

Examples of the materials of the base film are polyethylene, polypropylene, an ethylene-propylene copolymer, polybutene-1, poly-4-methylepentene-1, an ethylene-vinyl acetate copolymer, an ethylene-acrylic acid copolymer, an α-olefin homopolymer or copolymer such as ionomer or the mixture thereof, polyurethane, a styrene-ethylene-butene and pentane-based copolymer, a thermoplastic elastomer such as a polyamide-polyol copolymer, and a mixture thereof. Also, the base film may be also a mixture of two or more materials selected from the above-mentioned group, and it may be single-layered or multi-layered.

The thickness of the pressure-sensitive adhesive film 13 is not specifically restricted, and it is appropriately set, desirably, in a range of 50 to 200 μm.

The resin used for the pressure-sensitive adhesive layer of the pressure-sensitive adhesive film 13 is not specifically restricted, and the examples of the resin are a chlorinated polypropylene resin, an acrylic resin, a polyester resin, a polyurethane resin, an epoxy resin, and the like, which are generally used for the pressure-sensitive adhesive.

The resin of the adhesive layer is mixed appropriately with an acrylic-based pressure-sensitive adhesive, a radiation polymerization compound, an initiator of photopolymerization, a curing agent, and the like, thereby making the pressure-sensitive adhesive. The thickness of the pressure-sensitive adhesive layer is not specifically restricted, and it is appropriately set, desirably, in a range of 5 to 30 μm.

The radiation polymerization compound is added to the pressure-sensitive adhesive layer, and the pressure-sensitive adhesive layer is easily peeled off from the adhesive layer by means of radiation curing. For example, the radiation polymerization compound is formed of a low molecular weight compound having at least two or more photopolymerization carbon-carbon double bonds in a molecule having a three-dimensional net-shaped structure by means of light irradiation.

In more detail, the examples of the radiation polymerization compound are trimethylolpropane triacrylate, pentaerythritol triacrylate, pentaerythritol tetra acrylate, dipentaerythritol monohydroxy penta acrylate, dipentaerythritol hexa acrylate, 1,4-butyleneglycol diacrylate, 1,6-hexandiol deacrylate, polyethyleneglycol deacrylate, oligoester acrylate, and the like. In addition to the acrylate-based compounds as mentioned above, an example of the radiation polymerization compound is urethane acrylated oligomer. The urethane acrylated oligomer is obtained by reacting acrylate or methacrylate containing the hydroxyl group (for example, 2-hydroxy ethylacrylate, 2-hydroxy ethylmethacrylate, 2-hydroxy propylacrylate, 2-hydroxy propylmethacrylate, polyethylene glycol acrylate, polyethylene glycol methacrylate, and the like) to a terminated isocyanator urethane prepolymer that is obtained by reacting a polyol compound such as polyester or polyether to a polyhyfric isocyanato compound (for example, 2,4-trilene diisocyanator, 2,6-trilene diisocyanator, 1,3-xylylenediisocyanator, 1,4-xylylenediisocyanator, diphenylmethane 4,4-diisocyanator, and the like). The pressure-sensitive adhesive layer is formed of a mixture of two or more resins selected from the above-mentioned resins.

Examples of the initiator of photopolymerization are isopropylbenzoinether, isobutylbezoinether, benzophenone, michler's ketone, chlorothioxanthone, dodecylthioxanthone, dimethyloxanthone, diethyloxanthone, benzyldimethylketal, α-hydroxy cyclo hexylphenylketon, 2-hydroxymethylphenylpropane, and the like. An amount of the initiator of photopolymerization added is preferably from 0.01 to 5 parts by weight, to 100 parts by weight of an acrylic copolymer.

(Support Member)

The support member 14 is formed at the both end portions of the release film 11 in a short side direction of the release film 11, on a second surface 11b of the release film 11 opposite to the first surface 11a on which the adhesive layer 12 and the pressure-sensitive adhesive film 13 are formed. Like this, the formation of the support member 14 enables the winding pressure applied to the tape when the wafer processing tape 10 is wound to a roll shape to be distributed or collected to the support member 14, thereby suppressing the formation of the transfer marks on the adhesive layer 12.

Also, if the support member 14 is formed on the first surface 11a on which the adhesive layer 12 and the pressure-sensitive adhesive film 13 are formed, the support member 14 has the limitation in the width thereof, but according to the present invention, the support member 14 is extended in the width thereof, thereby more effectively suppressing the formation of the transfer marks on the adhesive layer 12.

Further, the support member 14 is formed on the second surface 11b of the release film 11, thereby advantageously enabling the allowance of the position error of the support member 14 to be large.

The support member 14 is formed on the area corresponding to the outside of the adhesive layer 12 formed on the first surface 11a of the release film 11, on the second surface 11b of the release film 11, that is, on an area R occupied from the end portion of the release film 11 to the adhesive layer 12 on the second surface 11b of the release film 11. According to this structure, the adhesive layer 12 and the support member 14 formed on the second surface 11b of the release film 11 are not overlapped at the time when the tape 10 is wound, thereby preventing the transfer marks from being formed on the adhesive layer 12.

The support member 14 is formed intermittently or continuously along the longitudinal direction of the release film 11, but from the viewpoint of more effectively suppressing the formation of the transfer marks, preferably, the support member 14 is formed continuously along the longitudinal direction of the release film 11.

Figure 2:
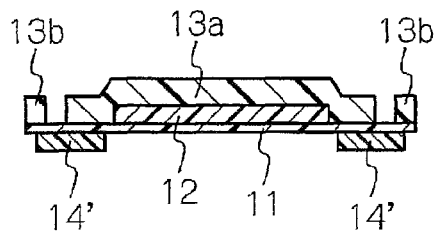
FIG. 2 is a sectional view showing a modified example of the wafer processing tape shown in FIG. 1.

The support member 14 has a thickness corresponding to the step between the area where the adhesive layer 12 and the round label portion 13a of the pressure-sensitive adhesive film 13 are stacked on each other and the surrounding portion 13b of the pressure-sensitive adhesive film 13, that is, equal to the adhesive layer 12 or thicker than the adhesive layer 12. FIG. 2 is a sectional view showing the example of a support member 14' having a thicker thickness than the adhesive layer 12.

At the time of winding the tape 10, the formation of the support member 14' having the equal or thicker thickness to or than the adhesive layer 12 enables the pressure-sensitive adhesive film 13 to be brought into contact with the second surface 11b of the release film 11 or enables the space between the pressure-sensitive adhesive film 13 and the second surface 11b to be formed without any contact with each other, thereby preventing the second surface 11b of the release film 11 from strongly pressurizing the soft adhesive layer 12, while interposing the pressure-sensitive adhesive film 13 therebetween. Accordingly, the formation of the transfer marks can be more effectively suppressed.

The support member 14 of the present invention has a coefficient of linear expansion of 300 ppm/° C. or less. The wafer processing tape is under specific environments where the changes of temperature are severely made. For example, the wafer processing tape is under the environments wherein the low temperature (having a range of −20 to 5° C.) is kept during keeping and delivery and wherein the heating attachment in a range of 70 to 80° C. on a heater table is conducted to allow the adhesive to be heated and soft, thereby enhancing the adhesive force, at the time of attaching the adhesive layer of the tape to the semiconductor wafer. If the size of the support member 14 is varied by the changes of the temperature, air may enter the space between the release film 11 and the pressure-sensitive adhesive film 13 and the space between the adhesive layer 12 and the pressure-sensitive adhesive film 13, thereby forming voids therebetween and further causing the attachment defect to the semiconductor wafer. If the attachment defect occurs, the production yield is decreased in the dicing process for the semiconductor wafer, in the expanding process of the tape, in the picking up process of the chip, and in the mounting process of the chip that are carried out in the next steps. According to the present invention, since the support member having a low coefficient of linear expansion of 300 ppm/° C. or less is used, the formation of the transfer marks can be more effectively suppressed, and further, since the variations of the size of the support member are small under the use environments where the changes of the temperature are severely made, the formation of the voids can be more effectively suppressed.

So as to more effectively suppress the formation of the transfer marks and voids, the coefficient of linear expansion of the support member 14 is desirably 150 ppm/° C. or less, and more desirably 70 ppm/° C. or less. The lowest limit of the coefficient of linear expansion of the support member 14 is not specially defined, but generally, it is 0.1 ppm/° C.

Further, the difference between the coefficient of linear expansion of the support member 14 and the coefficient of linear expansion of the release film 11 is preferably 250 ppm/° C. or less. If the difference therebetween is more than 250 ppm/° C., the difference between the sizes of the support member 14 and the release film 11 occurs by the changes of the temperature from the low temperature state during keeping and delivery to the room temperature state while in use, thereby causing a variety of defects as will be discussed below.

First, if the difference between the sizes of the support member 14 and the release film 11 occurs by the changes of the temperature, as mentioned above, the voids are formed between the release film 11 and the pressure-sensitive adhesive film 13 and between the adhesive layer 12 and the pressure-sensitive adhesive film 13.

Second, when the tape is handled to a roll shape by a user, it is very likely to stop the winding. In more detail, even though the tape is normally wound at the time of manufacturing and shipping, the difference between the sizes of the support member 14 and the release film 11 occurs when the tape is used at a room temperature after drawn from a refrigerator or when it is kept to the refrigerator after the use at the room temperature, thereby increasing the possibility where the winding stops.

Third, since the gap between the sheets wound to the roll shape occurs by the difference of sizes, foreign materials may enter the lateral surface of the roll.

Fourth, if the number of times the wafer processing tape is wound is large or if the width of the product is large, the cooling speeds between the core of the roll and the outer periphery of the roll are different from each other when the roll of product is kept to the refrigerator after the use at the room temperature. Accordingly, the difference of the sizes between the support member 14 and the release film 11 is made by the difference of the linear expansion between the core of the roll and the outer periphery of the roll, thereby raising the possibility where the shape of the entire roll is varied.

According to the present invention, the coefficient of linear expansion is an increasing rate of spatial expansion of an object when a temperature is changed at a static pressure. If it is assumed that a temperature is T and the length of a solid is L, the coefficient α of linear expansion thereof is given by the following expression.

$$\alpha = (1/L) \cdot (\partial L / \partial T)$$

The measurement of the coefficient of linear expansion according to the present invention is based upon the test method of linear expansion rate through thermomechanical analysis of plastic defined in JIS K7197, and while using a thermomechanical analyzer TMA, the sample cut to a length of 15 mm, a width of 5 mm, and a distance between zippers of 10 mm is measured under the conditions of the tensile load of 10 g, a temperature raising speed of 5° C./min, a $N_2$ gas atmosphere, and a measuring temperature range of −20° C. to 50° C.

The coefficient of static friction between the support member 14 and the base film constituting the pressure-sensitive adhesive film 13 is preferably in a range of 0.2 to 2.0 and more preferably in a range of 0.6 to 1.6. In a case where the wafer processing tape is wound to the roll shape, the surrounding portion 13b of the pressure-sensitive adhesive film 13 formed on the first surface 11a of the release film 11 comes into close contact with the support member 14 formed on the second surface 11b of the release film 11, such that if the coefficient of static friction between the support member 14 and the base film constituting the pressure-sensitive adhesive film 13 is less than 0.2, it is easy to generate the error in winding during the manufacturing or use, thereby causing a bad handling result. On the other hand, if the coefficient of static friction between the support member 14 and the base film constituting the pressure-sensitive adhesive film 13 is 2.0 or more, a resistance between the base film of the pressure-sensitive adhesive film 13 and the support member 14 is very high, the handling in the manufacturing process becomes bad or the tape is wound to a zigzag shape when it wound at a high speed. Accordingly, as the coefficient of static friction between the support member 14 and the base film constituting the pressure-sensitive adhesive film 13 is in a range of 0.2 to 2.0, the error in winding of the tape 10 can be prevented, the high speed winding can be achieved, and the winding number can be increased.

According to the present invention, the coefficient of static friction between the support member 14 and the base film constituting the pressure-sensitive adhesive film 13 is measured by the following method defined in JIS K7125.

Samples of the base film of the pressure-sensitive adhesive film 13 and the support member 14 cut to 25 mm (width)×100 mm (length) are laminated to each other, while the lower side film being fixed. Next, a weight of 200 g is disposed on the laminated films, thereby applying load W to the laminated films, and the upper side film is pulled at a speed of 200 mm/min, thereby measuring a force Fd (g) at the time of sliding. Thus, the coefficient of static friction (μd) is obtained by the following expression.

$$\mu d = Fd/W$$

Figure 3:
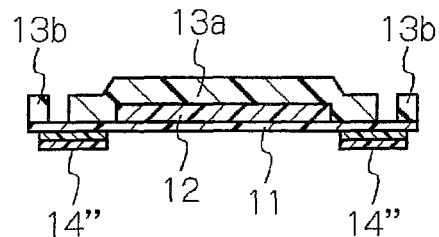
FIG. 3 is a sectional view showing another modified example of the wafer processing tape shown in FIG. 1.

The support member 14 is formed of, for example, a pressure-sensitive adhesive tape made by applying a pressure-sensitive adhesive to a resin base film. The pressure-sensitive adhesive tape is attached at a predetermined position on the both end portions of the second surface 11b of the release film 11, thereby forming the wafer processing tape 10 according to the present invention. The pressure-sensitive adhesive tape is formed of a single layered, and as shown in FIG. 3, it may be formed of laminated thin films.

If the resin of the base film of the pressure-sensitive adhesive tape satisfies the range of the coefficient of linear expansion as mentioned above and resists the winding pressure, it does not have any limitation in the selection of the material. When it is considered that the base film should have heat resistance and smoothness and also should be easy to be purchased, the base film is desirably selected from the group consisting of polyethylene terephthalate, polypropylene, and high density polyethylene.

The pressure-sensitive adhesive of the pressure-sensitive adhesive tape does not have any limitation in the composition and physical properties, if the pressure-sensitive adhesive is not peeled off from the release film 11 during the winding and keeping processes of the tape 10.

Also, the support member 14 may be formed of a colored support member. When the tape 10 of the present invention is wound to the roll shape, the kind of the tape can be clearly recognized through the colored support member. For instance, as the colors of the colored support member 14 are different in accordance with the type and thicknesses of the wafer processing tape 10, the type and thicknesses of the tape 10 can be easily identified, thereby suppressing and preventing the generation of artificial errors.

Second Embodiment

An explanation of a wafer processing tape according to a second embodiment of the present invention will be explained in detail with reference to the attached drawings.

Figure 4:
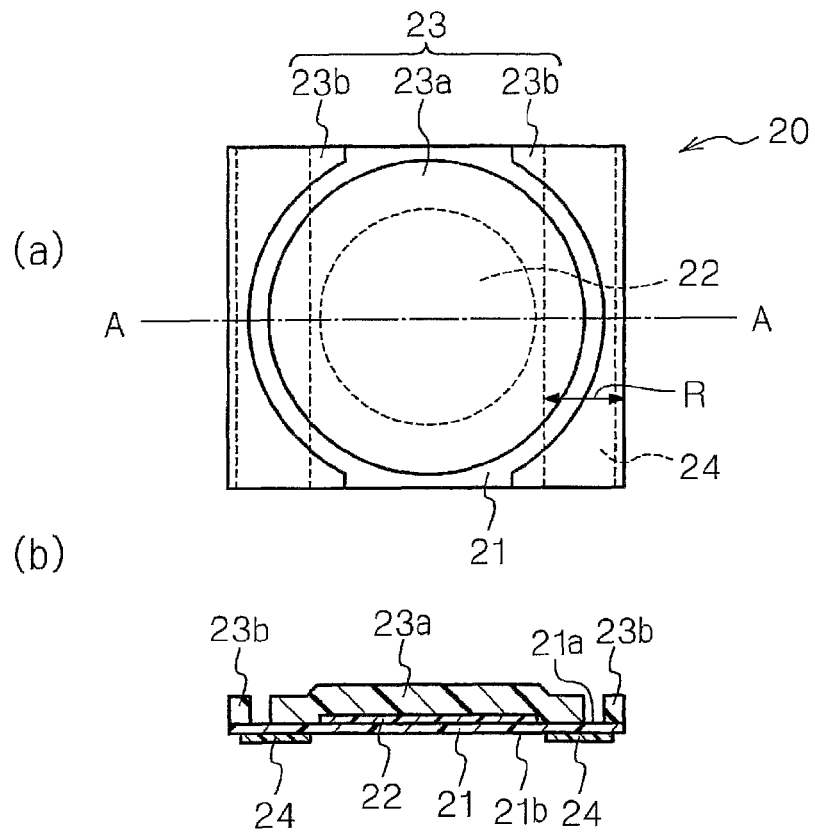
FIG. 4(a) is a plan view showing a wafer processing tape according to a second embodiment of the present invention.
FIG. 4(b) is a sectional view taken along the line A-A in FIG. 4(a).

FIG. 4(a) is a plan view showing a wafer processing tape according to a second embodiment of the present invention, and FIG. 4(b) is a sectional view taken along the line A-A of FIG. 4(a).

As shown in FIGS. 4(a) and 4(b), a wafer processing tape 20 according to the present invention includes a release film 21 having a relatively long length, an adhesive layer 22, a pressure-sensitive adhesive film 23, and a colored support member 24.

The adhesive layer 22 is formed on a first surface 21a of the release film 21 and has a round label shape corresponding to the shape of the semiconductor wafer. The pressure-sensitive adhesive film 23 has a round label portion 23a adopted to cover the adhesive layer 22 in such a manner as to be brought into contact with the release film 21 around the adhesive layer 22 and a surrounding portion 23b adopted to surround the outside of the round label portion 23a. The surrounding portion 23b completely surrounds the outside of the round label portion 23a and alternatively incompletely surrounds the outside of the round label portion 23a, as shown in FIGS. 4(a) and 4(b). The round label portion 23a has a shape corresponding to the dicing ring frame. The colored support member 24 is formed at the both end portions of the release film 21 in a short side direction of the release film 21, on a second surface 21b of the release film 21 opposite to the first surface 21a on which the adhesive layer 22 and the pressure-sensitive adhesive film 23 are formed.

Hereinafter, each component of the wafer processing tape 20 according to the second embodiment of the present invention will be in detail described.
(Release Film)

Examples of the release film 21 used in the wafer processing tape 20 are a polyethylene terephthalate (PET)-based film, a polypropylene-based film, and a film on which release coating is applied, as well know in this field.

The thickness of the release film 21 is not specifically restricted, and it is appropriately set, desirably, in a range of 25 to 50 μm.
(Adhesive Layer)

As noted above, the adhesive layer 22 is formed on the first surface 21a of the release film 21 and has a round label shape corresponding to the shape of the semiconductor wafer.

The adhesive layer 22 is used as adhesive attached on the underside of the chip when the chip is picked up after the semiconductor wafer is attached and diced so as to fix the chip to a substrate or a lead frame. The adhesive layer 22 is desirably formed of a pressure-sensitive adhesive including at least one selected from the group consisting of an epoxy-based resin, an acrylic-based resin, and a phenol-based resin. Besides, an example of the adhesive layer 22 is a polyimide-based resin or a silicone-based resin. The thickness of the adhesive layer 22 is appropriately set, desirably, in a range of 5 to 100 μm.
(Pressure-Sensitive Adhesive Film)

As mentioned above, the pressure-sensitive adhesive film 23 has the round label portion 23a corresponding to the shape of the dicing ring frame and the surrounding portion 23b adapted to surround the outside of the round label portion 23a. The pressure-sensitive adhesive film 23 is formed by removing the surrounding area of the round label portion 23a from a film type pressure-sensitive adhesive by means of pre-cut processing.

The pressure-sensitive adhesive film 23 has a sufficiently high adhesive force at the time of dicing the semiconductor wafer so as not to peel off the semiconductor wafer therefrom and has a low adhesive force at the time of picking up the chips after the dicing so as to easily peel the chip off from the adhesive layer. For example, the adhesive film 23 is formed by applying a pressure-sensitive adhesive layer on a base film.

The base film of the adhesive film 23 is formed of a conventional known material, and it desirably has a radiolucent property, if the pressure-sensitive adhesive layer as will be discussed below is formed of a radiation-curing material.

Examples of the materials of the base film are polyethylene, polypropylene, an ethylene-propylene copolymer, poly-butene-1, poly-4-methylepentene-1, an ethylene-vinyl acetate copolymer, an ethylene-acrylic acid copolymer, an α-olefin homopolymer or copolymer such as ionomer or the mixture thereof, polyurethane, a styrene-ethylene-butene and pentane-based copolymer, a thermoplastic elastomer such as a polyamide-polyol copolymer, and a mixture thereof. Also, the base film may be also a mixture of two or more materials selected from the above-mentioned group, and it may be single-layered or multi-layered.

The thickness of the adhesive film 23 is not specifically restricted, and it is appropriately set, desirably, in a range of 50 to 200 μm.

The resin used for the adhesive layer of the adhesive film 23 is not specifically restricted, and examples of the resin are a chlorinated polypropylene resin, an acrylic resin, a polyester resin, a polyurethane resin, an epoxy resin, and the like, which are generally used for the pressure-sensitive adhesive.

Desirably, the resin of the pressure-sensitive adhesive layer is mixed appropriately with an acrylic-based pressure-sensitive adhesive, a radiation polymerization compound, an initiator of photopolymerization, a curing agent, and the like, thereby making the pressure-sensitive adhesive. The thickness of the pressure-sensitive adhesive layer is not specifically restricted, and it is appropriately set, desirably, in a range of 5 to 30 µm.

The radiation polymerization compound is added to the pressure-sensitive adhesive layer, and the pressure-sensitive adhesive layer is easily peeled off from the adhesive layer by means of radiation curing. For example, the radiation polymerization compound is formed of a low molecular weight compound having at least two or more photopolymerization carbon-carbon double bonds in a molecule having a three-dimensional net-shaped structure by means of light irradiation.

In more detail, examples of the radiation polymerization compound are trimethylolpropane triacrylate, pentaerythritol triacrylate, pentaerythritol tetra acrylate, dipentaerythritol monohydroxy penta acrylate, dipentaerythritol hexa acrylate, 1,4-butyleneglycol diacrylate, 1,6-hexandiol deacrylate, polyethyleneglycol deacrylate, oligoester acrylate, and the like. In addition to the acrylate-based compounds as mentioned above, an example of the radiation polymerization compound is urethane acrylated oligomer. The urethane acrylated oligomer is obtained by reacting acrylate or methacrylate containing the hydroxyl group (for example, 2-hydroxy ethylacrylate, 2-hydroxy ethylmethacrylate, 2-hydroxy propylacrylate, 2-hydroxy propylmethacrylate, polyethylene glycol acrylate, polyethylene glycol methacrylate, and the like) to a terminated isocyanator urethane prepolymer that is obtained by reacting polyol compounds like polyester or polyether and polyhyfric isocyanato compounds (for example, 2,4-trilene diisocyanator, 2,6-trilene diisocyanator, 1,3-xylylenediisocyanator, 1,4-xylylenediisocyanator, diphenylmethane 4,4-diisocyanator, and the like).

The pressure-sensitive adhesive layer may be also a mixture of two or more resins selected from the above-mentioned resins.

Examples of the initiator of photopolymerization are isopropylbenzoinether, isobutylbezoinether, benzophenone, michler's ketone, chlorothioxanthone, dodecylthioxanthone, dimethyloxanthone, diethyloxanthone, benzyldimethylketal, α-hydroxy cyclo hexylphenylketon, 2-hydroxymethylphenylpropane, and the like. An amount of the initiator of photopolymerization added is preferably from 0.01 to 5 parts by weight, to 100 parts by weight of an acrylic copolymer.

(Colored Support Member)

Since the colored support member 24 is formed at the both end portions of the release film 21 in a short side direction of the release film 21, the kind of the tape can be clearly recognized when the wafer processing tape 20 is wound to the roll shape.

For instance, as the colors of the colored support member 24 are different in accordance with the type and thicknesses of the wafer processing tape 20, the type and thicknesses of the tape 20 can be easily identified, thereby suppressing and preventing the generation of artificial errors.

Figure 8:
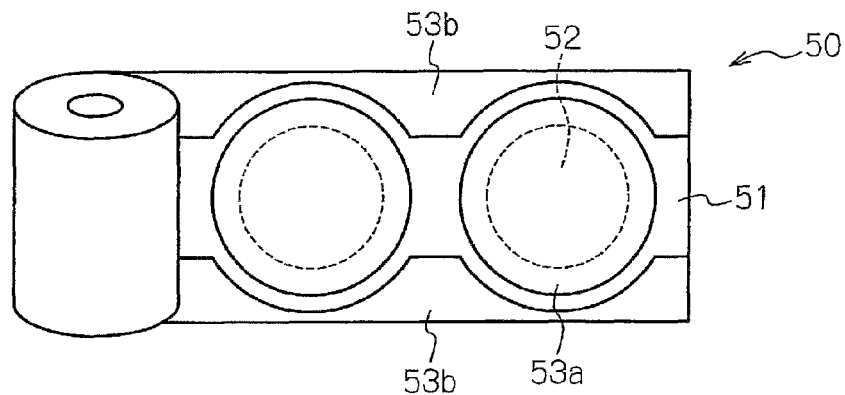
FIG. 8 is a perspective view showing a conventional wafer processing tape.
Figure 9:
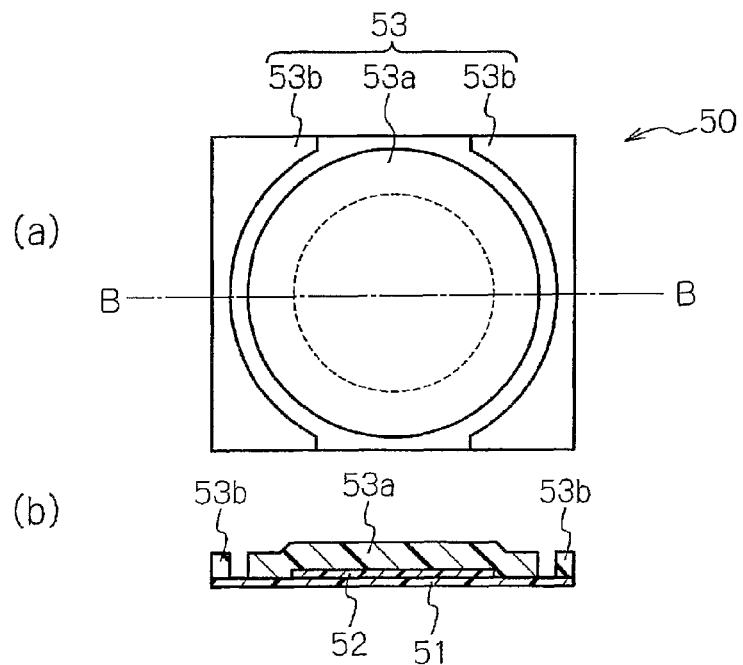
FIG. 9(a) is a plan view showing the conventional wafer processing tape.
FIG. 9(b) is a sectional view showing the conventional wafer processing tape.
Figure 10:
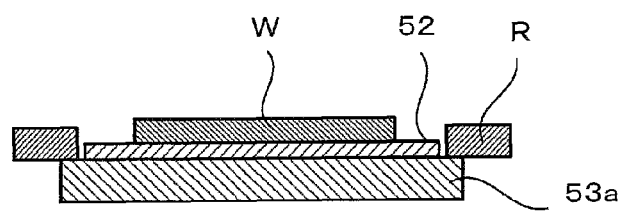
FIG. 10 is a sectional view showing the conventional wafer processing tape and a dicing ring frame in an attached state.

The wafer processing tape 20 is wound to a shape of a roll having a user's desired length as a product, and alternatively, the tape 20 is wound and shipped to the number of sheets corresponding to the number of the user's desired dicing die bonding tapes. However, since the length of the tape after the manufacturing of the product and the lengths of the raw materials such as the release film 21, the adhesive layer 22 and the pressure-sensitive adhesive film 23 used for the product are different from each other, the rest of the raw materials or the intermediate products is necessarily formed, thereby decreasing the production yield. The production yield is improved by connecting the products, but if the colors of the connected products are different from each other, the different colors are remarkably seen when viewed from the side of the roll (when viewed from the upper or lower direction on the ground as shown in FIG. 8), which makes the outer appearance of the product look bad in quality, thereby causing the roll tape to be returned in some cases.

Accordingly, the formation of the colored support member 24 allows somewhat different colors on the roll sides to be absorbed to the color of the colored support member 24, thereby improving the outer appearance of the product.

Figure 11:
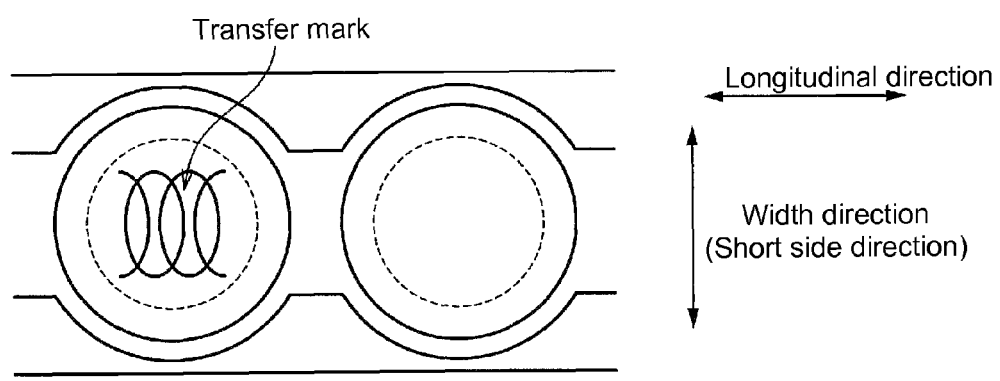
FIG. 11 is a schematic view showing a defect occurring on the conventional wafer processing tape.

Also, as shown in FIG. 4(b), the area where the adhesive layer 22 and the round label portion 23a of the pressure-sensitive adhesive film 23 are stacked on each other is thicker than the surrounding portion 23b of the pressure-sensitive adhesive film 23. Thus, when the tape 20 is wound to a roll shape as a product, the area where the adhesive layer 22 and the round label portion 23a of the pressure-sensitive adhesive film 23 are stacked on each other and the surrounding portion 23b of the pressure-sensitive adhesive film 23 are overlapped to each other, thereby causing the step between the two different areas to be transferred on the soft surface of the adhesive layer 22, that is, thereby causing transfer marks (for example, label marks, wrinkles, or winding marks) as shown in FIG. 11. The formation of the transfer marks is remarkably increased especially when the adhesive layer 22 is formed of a soft resin and is relatively thick in thickness or when the number of times the tape 20 is wound is large.

If the transfer marks are formed, the adhesion defect between the adhesive layer 22 and the semiconductor wafer is made to cause a bad quality of semiconductor wafer process.

In this case, the formation of the colored support member 24 enables the winding pressure applied to the tape 20 when the wafer processing tape 20 is wound to a roll shape to be distributed or collected to the colored support member 24, thereby suppressing the formation of the transfer marks on the adhesive layer 22.

Figure 5:
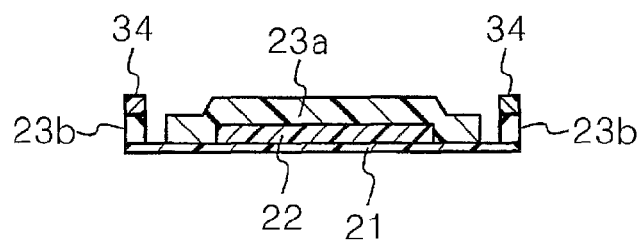
FIG. 5 is a sectional view showing a wafer processing tape according to a third embodiment of the present invention.

The colored support member 24 is formed on the second surface 21b of the release film 21, as shown in FIGS. 4(a) and 4(b), but from the viewpoint of improving the recognition of the kind of the tape, the colored support member 24 may be formed on the first surface 21a of the release film 21. As shown in FIG. 5, for instance, the colored support member 24 may be formed on the surrounding portion 23b of the pressure-sensitive adhesive film 23.

On the other hand, so as to suppress the formation of the transfer marks on the adhesive layer 22, the colored support member 24 is desirably formed on the second surface 21b of the release film 21. In this case, if the colored support member 24 is formed on the first surface 21a on which the adhesive layer 22 and the pressure-sensitive adhesive film 23 are formed, the colored support member 24 has the limitation in the width thereof. According to the present invention, however, if the colored support member 24 is formed at the both end portions of the release film 21 in a short side direction of the release film 21, on the second film 21b of the release film 21, the colored support member 24 is extended in the width thereof, thereby more effectively suppressing the formation of the transfer marks on the adhesive layer 22. Further, the colored support member 24 is formed on the second surface 21b of the release film 21, thereby advantageously enabling the allowance of the position error of the colored support member 24 to be large.

The colored support member 24 is desirably formed on the area corresponding to the outside of the adhesive layer 22 formed on the first surface 21a of the release film 21 on the second surface 21b of the release film 21, that is, on an area R occupied from the end portion of the release film 21 to the adhesive layer 22 on the second surface 21b of the release film 21, as shown in FIG. 4(a). According to this structure, the round label portion 23a of the pressure-sensitive adhesive film 23 formed on the first surface 21a of the release film 21 is not overlapped to the colored support member 24 formed on the second surface 21b of the release film 21 at the time when the tape 20 is wound, thereby preventing the transfer marks of the colored support member 24 from being formed on the adhesive layer 22.

The colored support member 24 is formed intermittently or continuously along the longitudinal direction of the release film 21, but from the viewpoint of more effectively suppressing the formation of the transfer marks, preferably, the colored support member 24 is formed continuously along the longitudinal direction of the release film 11.

Figure 6:
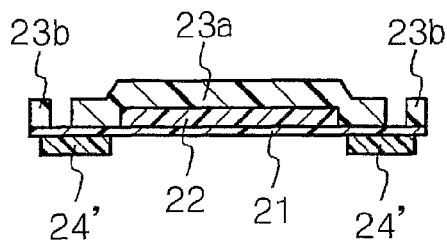
FIG. 6 is a sectional view showing a modified example of the wafer processing tape shown in FIG. 4.

The colored support member 24 has a thickness corresponding to the step between the area where the adhesive layer 22 and the round label portion 23a of the pressure-sensitive adhesive film 23 are stacked on each other and the surrounding portion 23b of the pressure-sensitive adhesive film 23, that is, equal to the adhesive layer 22 or thicker than the adhesive layer 22. FIG. 6 is a sectional view showing the example of a colored support member 24' having a thicker thickness than the adhesive layer 22.

At the time of winding the tape 20, the formation of the support member 24' having the equal or thicker thickness to or than the adhesive layer 22 enables the adhesive film 23 to come into contact with the second surface 21b of the release film 21 or enables the space between the pressure-sensitive adhesive film 23 and the second surface 21b to be formed without any contact with each other, thereby preventing the second surface 21b of the release film 21 from strongly pressurizing the soft adhesive layer 22, while interposing the pressure-sensitive adhesive film 23 therebetween. Accordingly, the formation of the transfer marks can be more effectively suppressed.

The colored support member 24 of the present invention has a coefficient of linear expansion of 300 ppm/° C. or less. If the coefficient of linear expansion of the colored support member 24 is more than 300 ppm/° C., the variation of the size becomes high under the environments of the changes of temperature wherein heating is conducted in a next process or the keeping and delivery states at a low temperature (having a range of −20° C. to 5° C.) are changed to the use state at a room temperature.

From the viewpoint of preventing the winding error of the wafer processing tape 20, moreover, the colored support member 24 is desirably formed of a material having a predetermined friction coefficient. Accordingly, the winding error of the tape 20 is prevented, thereby performing the winding operation at a high speed and increasing the number of winding times.

Figure 7:
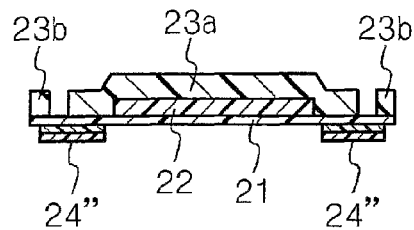
FIG. 7 is a sectional view showing another modified example of the wafer processing tape shown in FIG. 4.

The colored support member 24 is formed of, for example, a pressure-sensitive adhesive tape made by applying pressure-sensitive adhesive to a colored resin base film. The pressure-sensitive adhesive tape is attached at a predetermined position on the both end portions of the second surface 21b of the release film 21 or on the surrounding portion 23b of the pressure-sensitive adhesive film 23 of the first surface 21a of the release film 21, thereby forming the wafer processing tape 20 according to the present invention. The pressure-sensitive adhesive tape is formed of a single layered, and as shown in FIG. 7, it may be formed of laminated thin films.

If the resin of the colored base film of the pressure-sensitive adhesive tape has a predetermined friction coefficient for the adhesive film 23 as mentioned above and resists the winding pressure, it does not have any limitation in the selection of the material. When it is considered that the colored base film should have heat resistance and smoothness and also should be easy to be purchased, examples of the colored base film are polyethylene terephthalate PET and polyester.

The pressure-sensitive adhesive of the pressure-sensitive adhesive tape does not have any limitation in the composition and physical properties, if the pressure-sensitive adhesive is not peeled off from the release film 21 during the winding and keeping processes of the tape 20.

Next, the present invention will be in more detail described below with reference to examples. On the other hand, the present invention is not limited to the following examples set out below.

(1) Manufacturing of Pressure-Sensitive Adhesive Film
(Pressure-Sensitive Adhesive Film 1A)

A mixture having 128 g of n-butylacrylate, 307 g of 2-ethylhexylacrylate, 67 g of methymethacrylate, 1.5 g of methacrylic acid, and benzoyl peroxide as a polymerization initiator was added appropriately to 400 g of toluene as a solvent, and the reaction temperature and reaction time were adjusted to produce a compound 1 having a functional group.

Next, to the polymer solution thus obtained was then added a compound 2 having radiation curing carbon-carbon double bonds and functional group, which was produced by adding 2.5 g of 2-hydroxyethylmetacrylate that was synthesized from separate methacrylic acid and ethylglicol and a hydroquinone as a polymerization inhibitor, and the reaction temperature and reaction time were adjusted to produce a compound A having radiation curing carbon-carbon double bonds. After that, 1 parts by weight of Colonate L (manufactured by Japan Polyurethane Industry Co., Ltd.) as the polyisocyanate B, 0.5 parts by weight of Irgacure 184 (manufactured by Ciba-Geigy Industry Co., Ltd.) as the initiator of photopolymerization, and 150 parts by weight of ethyl acetate as a solvent, to 100 parts by weight of the compound A were added and mixed to the compound A, thereby producing a radiation curing pressure-sensitive adhesive layer composition.

Next, the pressure-sensitive adhesive layer composition thus obtained was applied to an ethylene-vinyl acetate copolymer base film having a thickness of 100 μm so as to have a dry film having a thickness of 20 μm and was then dried at 110° C. for 3 minutes, thereby producing the pressure-sensitive adhesive film 1A.

(Pressure-Sensitive Adhesive Film 1B)

The processing was carried out in the same manner as in the pressure-sensitive adhesive film 1A, except that the ethylene-vinyl acetate copolymer base film having a thickness of 100 μm was subjected to blast cleaning on one side surface thereof.

(Pressure-Sensitive Adhesive Film 1C)

The processing was carried out in the same manner as in the pressure-sensitive adhesive film 1A, except that the ethylene-vinyl acetate copolymer base film having a thickness of 100 μm was subjected to release coating on one side surface thereof.

(2) Release Film

Release films 2A and 2B as mentioned below were used.
Release film 2A: a polyethylene terephthalate film having a thickness of 25 μm and subjected to release coating
Release film 2B: a polypropylene film having a thickness of 25 μm and subjected to release coating The coefficients of linear expansion of the release films 2A and 2B were 60 ppm/° C. and 120 ppm/° C. through the measurement by a thermomechanical analyzer (manufactured by Rigakudenki Corp.).

3. Formation of Adhesive Layer 3a

A composition having 50 parts by weight of a cresol novolak epoxy resin (having an epoxide equivalent weight of 197, a molecular weight of 1200, and a softening point of 70° C.) as an epoxy resin, and 1.5 parts by weight of -mercatopropyl trimethoxysilane, 3 parts by weight of -ureidepropyl triethoxysilane, and 30 parts by weight of a silica filler having an average grain diameter of 16 nm as a silane coupling agent, was added and mixed with cyclohexanone, and next, the mixture was mixed again by means of a bead mill for 90 minutes.

To the composition thus obtained was added and mixed 100 parts by weight of an acrylic resin (having a weight average molecular weight of 800,000 and a glass transition temperature of –17° C.), 5 parts by weight of dipentaerythritol hexa acrylate as 6-functional acrylatemonomer, 0.5 parts by weight of an adduct of hexamethylene diisocyanate as a curing agent, and 2.5 parts by weight of Curezol 2PZ (manufactured by Shikoku Kasei Corp.) 2-phenylimidazole. At a subsequent step, the mixture was vacuumed and de-aerated, thereby producing an adhesive.

The adhesive was applied to the release films 2A and 2B and heated and dried at 110° C. for 1 minute, thereby forming a film having a thickness of 20 μm at a state of B stage (which is an intermediate state in the curing of the thermosetting resin). Thus, the adhesive layer 3A was formed on the release films 2A and 2B and was kept at a refrigerator (4) Manufacturing of Support member (Support Member 4A)

100 parts by weight of an acrylic resin (having a weight average molecular weight of 600,000 and a glass transition temperature of –20° C.) was mixed with 10 parts by weight of Colonate L (manufactured by Japan Polyurethane Industry Co., Ltd.) which is a polyisocyanate compound as a curing agent, thereby producing a pressure-sensitive adhesive composition.

Next, the pressure-sensitive adhesive composition thus obtained was applied to a polyethylene terephthalate film having a thickness of 75 μm to have a dry film having a thickness of 25 μm and was then dried at 110° C. for 3 minutes, thereby producing the support member 4A.

The coefficient of linear expansion of the support member 4A was 60 ppm/° C. through the measurement by the thermomechanical analyzer (manufactured by Rigakudenki Corp.).

(Support Member 4B)

The pressure-sensitive adhesive composition thus obtained was applied to a polypropylene film having a thickness of 75 μm so as to have a dry film having a thickness of 25 μm and was then dried at 110° C. for 3 minutes, thereby producing the support member 4B.

The coefficient of linear expansion of the support member 4B was 120 ppm/° C. through the measurement by the thermomechanical analyzer (manufactured by Rigakudenki Corp.).

(Support Member 4C)

The pressure-sensitive adhesive composition thus obtained was applied to a high density polyethylene film having a thickness of 50 μm so as to have a dry film having a thickness of 50 μm and was then dried at 110° C. for 3 minutes, thereby producing the support member 4C.

The coefficient of linear expansion of the support member 4C was 300 ppm/° C. through the measurement by the thermomechanical analyzer (manufactured by Rigakudenki Corp.).

(Support Member 4D)

The pressure-sensitive adhesive composition thus obtained was applied to a low density polyethylene film having a thickness of 50 μm so as to have a dry film having a thickness of 50 μm and was then dried at 110° C. for 3 minutes, thereby producing the support member 4D.

The coefficient of linear expansion of the support member 4D was 350 ppm/° C. through the measurement by the thermomechanical analyzer (manufactured by Rigakudenki Corp.).

(Support Member 4E)

The pressure-sensitive adhesive composition thus obtained was applied to an ultrahigh molecular weight polyethylene film having a thickness of 50 to have a dry film having a thickness of 50 μm and was then dried at 110° C. for 3 minutes, thereby producing the support member 4E.

The coefficient of linear expansion of the support member 4E was 400 ppm/° C. through the measurement by the thermomechanical analyzer (manufactured by Rigakudenki Corp.).

(Support Member 4F)

The pressure-sensitive adhesive composition thus obtained was applied to a polypropylene film having a thickness of 75 μm and being subjected to blasting cleaning on one side surface thereof so as to have a dry film having a thickness of 25 μm and was then dried at 110° C. for 3 minutes, thereby producing the support member 4F.

The coefficient of linear expansion of the support member 4F was 120 ppm/° C. through the measurement by the thermomechanical analyzer (manufactured by Rigakudenki Corp.).

(Support Member 4G)

The pressure-sensitive adhesive composition thus obtained was applied to a high density polyethylene film having a thickness of 50 μm and being subjected to release coating on one side surface thereof so as to have a dry film having a thickness of 50 μm and was then dried at 110° C. for 3 minutes, thereby producing the support member 4G.

The coefficient of linear expansion of the support member 4G was 300 ppm/° C. through the measurement by the thermomechanical analyzer (manufactured by Rigakudenki Corp.).

Example 1

The release film 2A on which the adhesive layer 3A is formed was moved from the refrigerator and was placed at a room temperature. Pre-cut processing for the adhesive layer 3A was carried out to a shape of a round having a diameter of 220 mm, while having a cut depth of 10 μm or less to the release film 2A. After that, the unnecessary portion on the adhesive layer 3A was removed, and so as to make the pressure-sensitive adhesive layer of the pressure-sensitive adhesive film 1A come into contact with the adhesive layer 3A, the release film 2A was laminated on the pressure-sensitive adhesive film 1A at a room temperature. Pre-cut processing for the pressure-sensitive adhesive film 1A was carried out to a shape of a round having a diameter of 290 mm in a concentric circle to the adhesive layer 3A, while having a cut depth of 10 μm or less to the release film 2A. Next, the support member 4A was attached at the both end portions of the release film 2A in a short side direction of the release film 2A on a second surface opposite to a first surface of the release film 2A on which the adhesive layer 3A and the pressure-sensitive adhesive film 1A were formed, thereby manufacturing the wafer processing tape according to the first embodiment of the present invention as shown in FIG. 1.

Example 2

The processing for manufacturing the wafer processing tape was carried out in the same manner as in Example 1, except that the support member 4A was replaced by the support member 4B.

Example 3

The processing for manufacturing the wafer processing tape was carried out in the same manner as in Example 1, except that the release film 2A was replaced by the release film 2B and the support member 4A was replaced by the support member 4C.

Example 4

The processing for manufacturing the wafer processing tape was carried out in the same manner as in Example 1, except that the support member 4A was replaced by the support member 4C.

Example 5

The processing for manufacturing the wafer processing tape was carried out in the same manner as in Example 1, except that the pressure-sensitive adhesive film 1A was replaced by the pressure-sensitive adhesive film 1B and the support member 4A was replaced by the support member 4C.

Example 6

The processing for manufacturing the wafer processing tape was carried out in the same manner as in Example 1, except that the pressure-sensitive adhesive film 1A was replaced by the pressure-sensitive adhesive film 1C and the support member 4A was replaced by the support member 4B.

Example 7

The processing for manufacturing the wafer processing tape was carried out in the same manner as in Example 1, except that the pressure-sensitive adhesive film 1A was replaced by the pressure-sensitive adhesive film 1B and the support member 4A was replaced by the support member 4G.

Example 8

The processing for manufacturing the wafer processing tape was carried out in the same manner as in Example 1, except that the pressure-sensitive adhesive film 1A was replaced by the pressure-sensitive adhesive film 1C and the support member 4A was replaced by the support member 4F.

Also, the coefficients of static friction between the support members and the base films of the pressure-sensitive adhesive films for the tapes for processing the semiconductor wafer in Examples 1 to 8 were measured. The results of the measurement are set forth in Table 1.

Comparative Example 1

The processing for manufacturing the wafer processing tape was carried out in the same manner as in Example 1, except that the release film 2A was replaced by the release film 2B and the support member 4A was replaced by the support member 4D.

Comparative Example 2

The processing for manufacturing the wafer processing tape was carried out in the same manner as in Example 1, except that the support member 4A was replaced by the support member 4D.

Comparative Example 3

The processing for manufacturing the wafer processing tape was carried out in the same manner as in Example 1, except that the support member 4A was replaced by the support member 4E.

Comparative Example 4

The processing for manufacturing the wafer processing tape was carried out in the same manner as in Example 1, except that no support member was formed.

Also, the coefficients of static friction between the support members and the base films of the pressure-sensitive adhesive films for the tapes for processing the semiconductor wafer in Comparative examples 1 to 3 were measured. The results of the measurement were set forth in Table 2.

[Estimation of the Suppression Property of the Formation of Transfer Marks (Label Marks, Wrinkles, or Winding Marks) and Voids]

The tapes for processing the semiconductor wafer according to Examples 1 to 8 and Comparative examples 1 to 4 were wound to a roll having 300 sheets of round pressure-sensitive adhesive films, thereby producing the rolls of the tapes for processing the semiconductor wafer. The rolls of the tapes were kept at a refrigerator (at 5° C.) for one month. After that, the rolls of the tapes were placed to a room temperature and were then unwound. Thus, it was checked whether the transfer marks exist or not, and the suppression property of the formation of the transfer marks and voids was evaluated in accordance with the following criterion of three steps ○, Δ, and x. The results of the estimation are set forth in Tables 1 and 2.

○: No transfer marks or voids are checked from every angle when viewed through eyes.

Δ: Some transfer marks or voids are checked in accordance with viewing angles.

x: Transfer marks or voids are checked from every angle when viewed through eyes.

[Existence of the Generation of Winding Error]

It was checked whether the winding error occurs or not while being manufactured, while being kept at the refrigerator, and while being in use at a room temperature, for the tapes for processing the semiconductor wafer according to Examples 1 to 8 and Comparative examples 1 to 4. The checking results are set forth in Tables 1 and 2.

[Estimation of Handling and Productivity]

It was checked that the handling and productivity were evaluated while being manufactured, while being kept at the refrigerator, and while being in use at a room temperature, for the tapes for processing the semiconductor wafer according to Examples 1 to 8 and Comparative examples 1 to 4, in accordance with the following criterion of three steps of ⊚, ○, and x. The results are set forth in Tables 1 and 2.

⊚: Handing and productivity are excellent.

○: Handing and productivity are good.

x: Handing and productivity are a little bad.

TABLE 1

| | 1st Embodiment | 2nd Embodiment | 3rd Embodiment | 4th Embodiment | 5th Embodiment | 6th Embodiment | 7th Embodiment | 8th Embodiment |
|---|---|---|---|---|---|---|---|---|
| Support member | 4A | 4B | 4C | 4C | 4C | 4B | 4G | 4F |
| Coefficient of linear expansion of support member (ppm/° C. ° C.) | 60 | 120 | 300 | 300 | 300 | 120 | 300 | 120 |
| Pressure-sensitive adhesive film | 1A | 1A | 1A | 1A | 1B | 1C | 1B | 1C |
| Release film | 2A | 2A | 2B | 2A | 2A | 2A | 2A | 2A |
| Coefficient of linear expansion of release film(ppm/° C. ° C.) | 60 | 60 | 120 | 60 | 60 | 60 | 60 | 60 |
| Adhesive layer | | | | 3A | | | | |
| Difference between coefficients of linear expansion of support member and release film (ppm/° C. ° C.) | 0 | 60 | 180 | 240 | 240 | 60 | 240 | 60 |
| Coefficients of static friction between support member and base film of pressure-sensitive adhesive film (—) | 0.9 | 0.9 | 0.6 | 0.6 | 0.4 | 1.8 | 0.1 | 2.5 |
| Transfer mark formation-suppressing effect | ○ | ○ | ○ | ○ | ○ | ○ | ○ | ○ |
| Void formation-suppressing effect | ○ | ○ | ○ | ○ | ○ | ○ | ○ | ○ |
| Generation of winding error | no | no | no | no | no | no | no | no |
| Handling and productivity | ◎ | ◎ | ◎ | ◎ | ○ | ○ | X | X |

TABLE 2

| | Comparative example 1 | Comparative example 2 | Comparative example 3 | Comparative example 4 |
|---|---|---|---|---|
| Support member | 4D | 4D | 4E | — |
| Coefficient of linear expansion of support member (ppm/° C. ° C.) | 350 | 350 | 400 | — |
| Pressure-sensitive adhesive film | 1A | 1A | 1A | 1A |
| Release film | 2B | 2A | 2A | 2A |
| Coefficient of linear expansion of release film (ppm/° C. ° C.) | 120 | 60 | 60 | 60 |
| Adhesive layer | | | 3A | |
| Difference between coefficients of linear expansion of support member and release film (ppm/° C. ° C.) | 230 | 290 | 340 | — |
| Coefficients of static friction between support member and base film of pressure-sensitive adhesive film (—) | 1.1 | 1.1 | 1.8 | — |
| Transfer mark formation-suppressing effect | ○ | ○ | ○ | X |

TABLE 2-continued

|  | Comparative example 1 | Comparative example 2 | Comparative example 3 | Comparative example 4 |
|---|---|---|---|---|
| Void formation-suppressing effect | Δ | X | X | ○ |
| Generation of winding error | no | no | no | no |
| Handling and productivity | ◎ | ◎ | ◎ | ◎ |

It was found that no transfer marks were formed in Examples 1 to 8 and Comparative examples 1 to 3 wherein the support member was formed on the underside of the wafer processing tape, whereas the transfer marks were formed in Comparative example 4 wherein no support member was formed. Accordingly, it could be understood that the formation of the transfer marks was suppressed by the formation of the support member.

Further, no voids were formed in Examples 1 to 8 wherein the coefficients of linear expansion of the support members were 300 ppm/° C. or less, whereas voids were formed in Comparative examples 1 to 3 wherein the coefficients of linear expansion of the support members were more than 300 ppm/° C. Accordingly, it could be understood that the formation of the support member caused by the changes of temperature was suppressed by the formation of the support member having the coefficient of linear expansion of the support member of 300 ppm/° C. or less.

In Comparative examples 1 to 3 wherein the formation of voids were checked, especially, the formation of voids were absolutely checked in Comparative examples 2 and 3 wherein the difference between the coefficients of linear expansion of the support member and the release film was 250 ppm/° C. or more. Accordingly, it could be understood that the voids were likely to be more easily formed when the difference between the coefficients of linear expansion of the support member and the release film was relatively big.

Further, it was checked that the handling and productivity were good in Examples 1 to 6 and Comparative examples 1 to 3 wherein the coefficients of static friction between the base film of the pressure-sensitive adhesive film and the support member is in a range of 0.2 to 2.0, whereas the handling and productivity were very bad in Example 7 wherein the coefficient of static friction between the base film of the pressure-sensitive adhesive film and the support member was less than 0.2 and in Example 8 wherein the coefficient of static friction between the base film of the pressure-sensitive adhesive film and the support member was more than 2.0. Especially, the winding error was generated in Example 7 wherein the coefficient of static friction between the base film of the pressure-sensitive adhesive film and the support member was less than 0.2.

As apparent from the foregoing, it was checked that when the tapes for processing the semiconductor wafer according to the present invention in Examples 1 to 8 were wound to the rolls, the formation of transfer marks was sufficiently suppressed and the generation of voids caused by the changes of temperature was also sufficiently suppressed.

The invention claimed is:
1. A wafer processing tape comprising:
a release film;
an adhesive layer formed on a first surface of the release film and having a predetermined planar shape;
a pressure-sensitive adhesive film having a label portion and a surrounding portion surrounding outside the label portion, said label portion having a predetermined planar shape and covering the adhesive layer so that the label portion contacts with the release film around the adhesive layer; and
a colored support member formed at both end portions of the release film in a short side direction of the release film,
wherein said colored support member is formed on an area on the second surface of the release film corresponding to an area on the first surface of the release film between an end portion of the release film and an outside of the adhesive layer, and an outer edge of said colored support member is offset from the end portion of the release film,
wherein said colored support member has a coefficient of linear expansion different from that of the release film by a difference of 250 ppm/° C. or less,
said colored support member has a thickness larger than that of the adhesive layer,
said pressure-sensitive adhesive film includes a pressure-sensitive adhesive layer and a base film,
said base film has a coefficient of static friction different from that of said colored support member by a difference of 0.2 to 2.0, and
said base film is formed of at least one of an α-olefin homopolymer or copolymer or a mixture thereof, polyurethane, a styrene-ethylene-butene and pentane-based copolymer, and a thermoplastic elastomer.

2. The wafer processing tape according to claim 1, wherein said colored support member is formed continuously along a longitudinal direction of the release film.

3. The wafer processing tape according to claim 1, wherein said colored support member has a layered structure having two or more layers.

4. The wafer processing tape according to claim 1, wherein said colored support member is formed of a pressure-sensitive adhesive tape having a pressure-sensitive adhesive applied on a base film formed of polyethylene terephthalate or polyester.

5. The wafer processing tape according to claim 1, wherein said colored support member has a color in accordance with a type of the wafer processing tape.

6. The wafer processing tape according to claim 1, wherein said colored support member has a color in accordance with a thickness of the wafer processing tape.

7. The wafer processing tape according to claim 1, wherein said colored support member is disposed on the second surface of the release film so that the outer edge of said colored support member is situated within an area corresponding to the surrounding portion of the pressure-sensitive adhesive film on the first surface of the release film.

8. The wafer processing tape according to claim 1, wherein said colored support member is disposed on the second surface of the release film so that an inner edge of said colored support member is situated outside an area corresponding to the surrounding portion of the pressure-sensitive adhesive film on the first surface of the release film.

9. The wafer processing tape according to claim 1, wherein said colored support member having the coefficient of linear expansion of 300 ppm/° C. or less.

10. The wafer processing tape according to claim 1, wherein a space is provided between the label portion of the pressure-sensitive adhesive film and the surrounding portion of the pressure-sensitive adhesive film.

* * * * *